United States Patent [19]
Sano

[11] 3,938,174
[45] Feb. 10, 1976

[54] SEMICONDUCTOR INTEGRATED CIRCUIT AND METHOD OF MANUFACTURE

[75] Inventor: Tadashi Sano, Suwa, Japan

[73] Assignee: Kabushiki Kaisha Seikosha, Tokyo, Japan

[22] Filed: Jan. 9, 1974

[21] Appl. No.: 432,116

[30] Foreign Application Priority Data
Jan. 9, 1973   Japan .................................. 48-4934

[52] U.S. Cl. ...................... 357/23; 357/41; 357/52; 357/59
[51] Int. Cl.² ..................... H01L 29/78; H01L 27/02; H01L 29/34, 29/04
[58] Field of Search .................... 357/41, 59, 23, 52

[56] References Cited
UNITED STATES PATENTS
3,711,753   1/1973   Brand et al. ........................ 357/59

Primary Examiner—Michael J. Lynch
Assistant Examiner—E. Wojciechowicz
Attorney, Agent, or Firm—Blum, Moscovitz, Friedman & Kaplan

[57] ABSTRACT

An integrated circuit has semiconductor devices on a substrate. The devices each have gates of polycrystalline silicon and the devices are insulated from each other by a stopper diffused into the substrate between said devices at least in the regions adjacent said gates. Reliability of the integrated circuit is improved by having each polycrystalline silicon gate formed with a region adjacent said stopper diffused with impurity of the same polarity as the impurity diffused in said stopper.

3 Claims, 6 Drawing Figures

SEMICONDUCTOR INTEGRATED CIRCUIT AND METHOD OF MANUFACTURE

BACKGROUND OF THE INVENTION

The gate threshold voltage $V_{th}$ of an insulated gate semiconductor device is given by $$V_{th} = \phi_{MS} + 2\phi_F - \frac{Q_B}{C_O} - \frac{Q_{SS}}{C_O} \qquad (1)$$

In this equation $\phi_{MS}$ is the difference in work functions between the gate electrode and the substrate, $\phi_F$ is the difference in Fermi potentials of the two materials, $Q_B$ is a quantity determined by the impurity concentration in the substrate, $Q_{SS}$ is the electric charge in the gate insulating film and $C_O$ is the electrostatic capacitance between the substrate and the gate electrode.

In this formula, $\phi_{MS}$, $\phi_F$ and $Q_B/C_O$ can be controlled comparatively readily by proper design and production technique. However $Q_{SS}/C_O$ is not only difficult to control but is subject to change subsequent to production, as the result of which integrated circuits of the type described have not been as reliable as would be desired.

The field insulating film which overlies the gate and the substrate is formed by chemical vapor deposition as the result of which it is difficult to decrease $Q_{SS}$. Further, where the registry of the gate and the demarcation between the conductive portion of the substrate and the stopper is not perfect, the threshold voltage of the portion facing the field insulating film can become extremely small or even negative. Consequently, unintended current can flow between the source and drain of a device.

SUMMARY OF THE INVENTION

To prevent the aforenoted unintended flow between source and drain in a device as the result of poor registry between the end of a polycrystalline silicon gate and the edge of the device in the width direction, a heavily doped diffused layer, termed a stopper, is formed in the substrate between devices. By this means $Q_B/C_O$ is made substantially larger than $Q_{SS}/C_O$. Further, the length of the gate in the width direction of the channel between the source and the drain of the device is such that it extends beyond the width of the channel on at least one side thereof. When the device is masked for diffusion of a stopper into the substrate, at least the side of the polycrystalline silicon gate adjacent the stopper region receives the same impurity as is diffused into the substrate. This side of the gate consequently becomes an insulator and prevents unintentional flow of current between the source and drain of a device thereby substantially reducing the possibility that the threshold voltage near the edge of the channel will become low or negative.

The width of the region of the gate having impurity diffused therein of the same polarity as said stopper, which region preferably corresponds to the region of the gate which extends beyond the width of the channel, should be at least equal to the maximum error anticipated in positioning a mask for diffusion of the stopper impurity into the substrate.

Accordingly, an object of the present invention is an improved integrated circuit of higher reliability than previously available.

Another object of the present invention is an improved integrated circuit having transistor devices on a semiconductive substrate where unintended current flow between source and drain in a given transistor device is avoided.

A further object of the present invention is an improved integrated circuit in which the gate of a transistor device extends beyond the width of the channel, the region of the gate extending beyond the width of the channel being converted into an insulator as a means of preventing a low or negative threshold voltage which could cause unintended current flow between source and drain of a transistor device.

An important object of the present invention is an improved method of manufacturing an improved integrated circuit in which unintended current flow between a source and drain in a transistor device in said circuit is avoided.

A significant object of the present invention is an improved method for manufacturing integrated circuits of high reliability wherein at least the side of the gate on a device adajcent the stopper region in the substrate is diffused with impurity simultaneously with diffusion of the stopper region between adjacent transistor devices.

Still other objects and advantages of the invention will in part be obvious and will in part be apparent from the specification.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENT

Figure 1A:
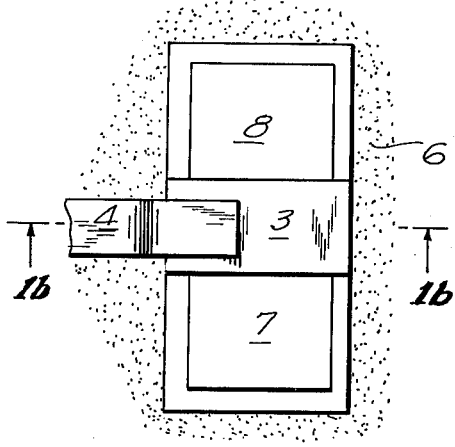
FIGS. 1a and 1b are plan and cross sectional views respectively of a transistor device in an integrated circuit in accordance with the prior art.
Figure 1B:
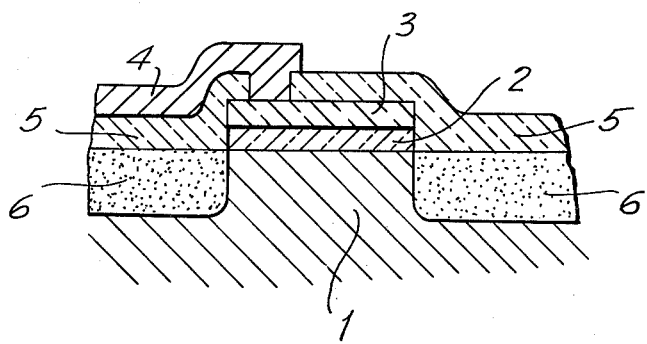

A transistor device which is part of an integrated circuit is shown in FIGS. 1a and 1b. Substrate 1 has thereon an insulating film 2 over which is a gate 3. Gate 3 is of polycrystalline silicon. Over gate 3 and portions of the substrate is a field insulating film 5 formed by means of chemical vapor deposition. Source 8 and drain 7 are formed in spaced relation in substrate 1 to define a channel therebetween. Between adjacent transistor devices are stopper regions 6 formed thereinto. Connections between devices are made by evaporating aluminum connectors 4 in an appropriate pattern, the connectors extending through apertures in the field insulating film 5.

In the manufacture of integrated circuits including a plurality of semi-conductor devices, said devices may be formed by diffusing impurities into sets of source and drain areas in a silicon chip, each set comprising a source area and a drain area separated by a channel. Using conventional techniques an insulating film is formed over the channel region of each device and a polycrystalline silicon gate is formed on that insulating film.

Figure 2A:
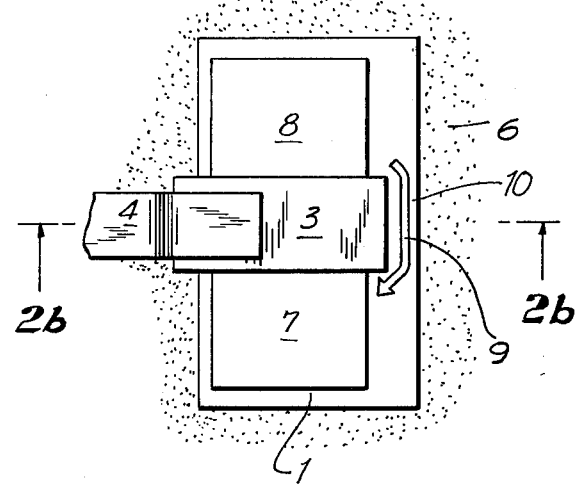
FIGS. 2a and 2b are plan and cross sectional views respectively of a transistor device in accordance with the prior art where registry between a gate and a stopper portion of the substrate is defective.
Figure 2B:
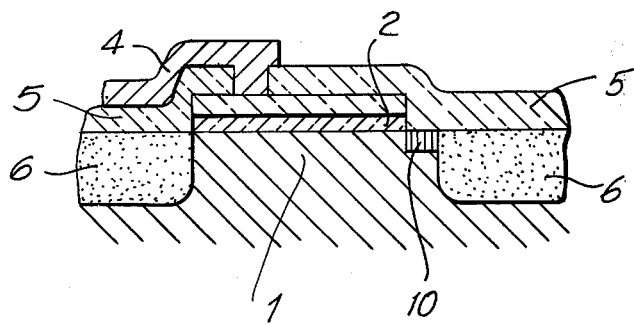

In FIGS. 1a and 1b the side edges of gate 3 are in registry with the side edges of the channel between the source and drain are in registry with the boundary between the channel and the stopper sections. Diffusion of the stopper impurity into the substrate takes place prior to formation of insulating film 5 and deposition of the aluminum connectors 4 but after the formation of polycrystalline silicon gate 3. Consequently, if the masking for the photo-etching process in which the area of the stopper 6 sections is determined is not perfect, then the edge of gate electrode 3 and the boundary of stopper section 6 may not be in registry, generating a gap as shown in FIG. 2a. This failure in registry can be due to expansion, contraction and warping of the wafer or chip on which the circuit is formed.

Where the registry is poor as shown in FIG. 2a, and if the threshold voltage is negative as influenced by $Q_{SS}$ which may be due to unintended and undesired impurity in the field insulating film, and inversion layer may be generated as shown as 10 in FIG. 2b. As a result, unintended and undesired current may flow between the source and drain as shown by arrow 9 of FIG. 2a.

This phenomenon may occur at the time the circuit is produced or may develop after the item has been placed in use. Consequently, the stability of the circuit is poor and reliability both on a short term and on a long term basis is unsatisfactory.

In accordance with the present invention, the problem is eliminated by preventing the formation of an unintentional and undesired inversion layer and simultaneously stabilizing the characteristic of the system. This is effected by varying not only $Q_B$ but also $\phi_{MS}$.

Figure 3A:
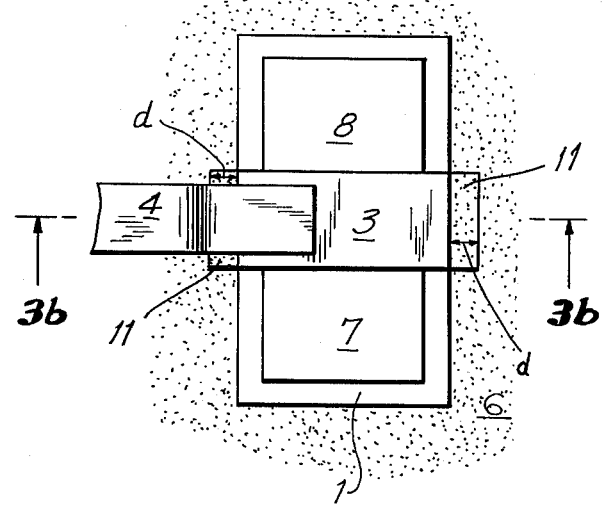
FIGS. 3a and 3b are plan and cross sectional views respectively of a transistor device in accordance with the present invention wherein registry between a gate and a stopper portion in a substrate is non-critical.
Figure 3B:
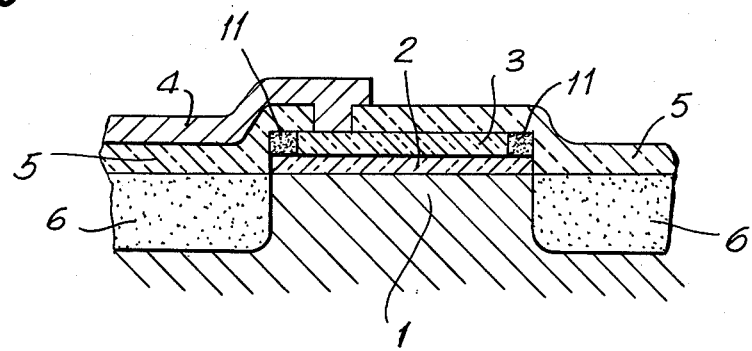

FIGS. 3a and 3b show how this objective is carried out. Polycrystalline silicon gate 3 extends beyond the sides of the transistor channel in the direction of its width by an amount which is at least as great as the maximum anticipated error in locating the etching mask. In diffusing the impurity into the substrate to render same into a stopper, the same impurity is diffused into at least one side portion 11 of gate 3 adjacent stopper region 6. This diffusion is preferably carried out simultaneously with diffusion of the stopper into the substrate so that the process of forming the stopper in the substrate need not be changed.

If the width of the diffused portion in the end or ends 11 of polycrystalline silicon gate 3 is at least equal to the maximum error which may occur in the process of positioning the mask, then the formation of an inversion layer is prevented and thereby, short circuiting of the source and drain under the influence of the field insulating film as shown by the arrow 9 of FIG. 2 is likewise prevented.

Controlled diffusion results in a polycrystalline silicon gate electrode which has a portion 3 containing impurity such that the conductivity of said portion 3 is of the same type as that of the source and drain, and a second portion 11 which contains an impurity which makes the conductivity of portion 11 different from that of the remainder of the gate layer. As a result, dependent on the nature and quantity of impurity diffused into the gate layer, a P-N junction may be generated between gate portion 3 and diffused portion 11.

Furthermore since the external potential is applied only to portion 3 of the gate electrode, diffused portion 11 will differ in potential from that of portion 3. As a result, it is possible that an inversion layer may be generated in the substrate thereunder, but such an inversion layer is not generated when a low voltage such as 1.5V is applied to the gate, because the value of $\phi_{MS} + 2\phi_F$ is large due to the polycrystalline silicon in portion 11 which contains the impurity whose conductivity is the same as that of the substrate, and the threshold voltage of the diffused portion 11 is about 1 volt higher than that of portion 3, since portion 3 contains the impurity which renders its conductivity similar to that of source 8 and drain 7.

Using the method of the present invention, the error in matching of the mask in the photo-etching process to the substrate becomes less critical so that it is unnecessary to lower $Q_{SS}$ in the field insulating film to so small a value as is necessary in conventional constructions. As a result, the ease of manufacture, the cost of manufacture and the product yield as well as the ultimate reliability are greatly improved. This takes into account the fact that variation of $Q_{SS}$ according to transfer of electric charge in the field insulating film was one of the causes of inferior reliability in conventional constructions so that integrated circuits manufactured by the present method and in accordance with the present construction are essentially independent of the change or value of $Q_{SS}$.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention, which as a matter of language, might be said to fall therebetween.

What is claimed is:

1. In an insulated gate semiconductor structure, a substrate bearing at least two semiconductor devices, each device including a source and a drain defining a channel therebetween, a gate insulating film overlying said channel, a polycrystalline silicon gate overlying said gate insulating film, a gate electrode connected to said gate, and stopper regions defined by impurity diffused into said substrate around each device and between said respective devices for inhibiting the formation of inversion layers in said substrate between the source and drain of each device between respective devices, the improvement comprising a stopper-diffused portion in said gate at at least one side of said gate in the channel-width direction adjacent a stopper region, said gate electrode being connected only to said stopper-free remainder of said gate, said stopper-diffused portion having impurity diffused therein of a conductivity-type corresponding to the conductivity-type of the impurity defining said stopper region and opposite in conductivity-type to at least the central region of said gate in the channel-width direction, said gate electrode being connected only to said region of said gate free of said stopper impurity, whereby a P-N junction is formed at at least said one side of said gate, and the threshold voltage necessary for producing an inversion layer under said one side of said gate is substantially greater than under the remainder of said gate.

2. The semiconductor integrated circuit as defined in claim 1 wherein each of said polycrystalline silicon gates extends beyond at least one side of the channel in the channel-width direction, said stopper-diffused portion of each said gate being at least defined by said extended portion.

3. The semiconductor integrated circuit as defined in claim 2 wherein said stopper-diffused portion of said gate is at least as great in width as the maximum anticipated error in positioning a mask for controlling the regions into which a stopper-impurity is to be diffused into said substrate adjacent the channel of each device to define a stopper region.

* * * * *